United States Patent
Ek

(10) Patent No.: US 7,741,917 B2
(45) Date of Patent: Jun. 22, 2010

(54) NOISE SHAPING TIME TO DIGITAL CONVERTER

(75) Inventor: Staffan Ek, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 40 days.

(21) Appl. No.: 12/266,878

(22) Filed: Nov. 7, 2008

(65) Prior Publication Data

US 2010/0117872 A1  May 13, 2010

(51) Int. Cl.
*H03K 5/00* (2006.01)
*H03L 7/00* (2006.01)

(52) U.S. Cl. .................................. 331/1 A; 327/1
(58) Field of Classification Search ............. 331/1 A, 331/18, 25; 327/1
See application file for complete search history.

(56) References Cited

U.S. PATENT DOCUMENTS

| | | | |
|---|---|---|---|
| 6,754,613 B2 * | 6/2004 | Tabatabaei et al. | 702/189 |
| 6,809,676 B1 | 10/2004 | Younis et al. | |
| 2005/0162204 A1 | 7/2005 | Lee et al. | |
| 2008/0069292 A1 | 3/2008 | Straayer et al. | |

FOREIGN PATENT DOCUMENTS

WO 01/69328 A2 9/2001

OTHER PUBLICATIONS

Fan, Y. "Time-to-Digital Converter for RF Frequency Syntheszer." Helsinki University of Technology, S-87.4198 Postgraduate Course in Electronic Circuit Design II, May 16, 2006. Available at http://www.ecdl.tkk.fi/education/4198/pdf/img-VND641200.pdf, p. 1-19.
Dudek, P. et al. "A High-Resolution CMOS Time-to-Digital Converter Utilizing a Vernier Delay Line." IEEE Transactions on Solid-State Circuits, vol. 35, No. 2, February 2000, pp. 240-247.

* cited by examiner

*Primary Examiner*—David Mis
(74) *Attorney, Agent, or Firm*—Coats & Bennett, P.L.L.C.

(57) ABSTRACT

According to an embodiment of a time to digital converter, the time difference between a signal of interest and a reference signal is measured by operating a digitally controlled oscillator at a first frequency during a first portion of the reference signal period and changing the operating frequency from the first frequency to a second frequency during the reference signal period as a function of the time difference between the signal of interest and the reference signal. The time to digital converter continuously counts how many signal transitions occur at an output of the digitally controlled oscillator during the reference signal period. The time difference between the signal of interest and the reference signal is estimated based on the number of signal transitions counted during the reference signal period.

20 Claims, 13 Drawing Sheets

NOISE SHAPING TIME TO DIGITAL CONVERTER

TECHNICAL FIELD

The present invention generally relates to time to digital converters, and more particularly relates to noise shaping time to digital converters.

BACKGROUND

A time to digital converter (TDC) outputs a digital representation of the time of arrival for each incoming pulse of a signal. A TDC can be formed by chaining together a string of inverters. A start-pulse is propagated through the inverter chain and sampled with a stop pulse. The number of inverters through which the start pulse passes provides a digital measure of the time from start to stop. The resolution associated with this type of TDC is typically limited by the gate delay of the inverters which is highly dependent on current, voltage and temperature. Also, the linearity of the TDC is limited because of device mismatches and typically traded against speed and resolution. Relatively small inverter stages are needed to improve the resolution of the TDC because small inverters have reduced parasitic capacitance. However, relatively large inverter stages are needed to improve device mismatch and linearity. Digital correction techniques and statistical methods can be used to linearize the transfer function of the TDC, but the resolution remains limited by gate delay.

Another type of TDC is the Vernier delay line which utilizes the difference in delay between two delay lines. However, device mismatch has an even greater adverse impact on the linearity of Vernier-based TDCs. In addition, a very long delay line is needed to achieve sufficient dynamic range. Other types of TDCs use a ring oscillator which is switched on when the time period measurement starts and off when the time period measurement ends. Switching can be done by gating inverter cells. Switching the ring oscillator on and off in this way sets the internal nodes of the TDC to a high impedance state when turned off. Noise shaping occurs when the parasitic capacitances of the ring oscillator maintain their voltages during the high impedance off state. Ring oscillator-based TDCs can achieve relatively high resolution and reject transistor mismatch effects. However, the high impedance off state creates a large sensitivity to noise and leakage currents. For example, conventional ring oscillator-based TDCs suffer from high leakage currents which affect oscillator voltages during high impedance states. With process scaling, the leakage current worsens and becomes strongly dependent of temperature. In addition, noise currents are injected into the high impedance nodes which also affect the oscillator voltages. Furthermore, the high impedance node voltages may be adversely affected by charge injection during switching. Counting errors can occur in the high impedance state because of the problems mentioned above. Conventional ring oscillator-based TDCs are highly voltage dependent during periods of stopping and starting, decreasing the noise-shaping performance of the TDCs.

SUMMARY

A TDC includes an oscillator which is switched between at least two different operating frequencies to achieve accurate digitized measurements of unknown time-quantities. Quantization noise shaping is implemented by the TDC to achieve highly precise time measurement results. Moreover, the linearity of the TDC is increased by scrambling errors introduced from mismatch between transistor devices. The TDC can be used in various applications such as a digital phase-locked loop (DPLL). Using the high accuracy TDC in a DPLL reduces quantization noise and the need for filtering. This in turn enables the use of higher bandwidths. A higher bandwidth improves oscillator noise filtering and reduces oscillator settling time, saving power and enabling the use of polar modulation schemes for transmitters. Improved TDC linearity also eliminates the need for additional circuitry to compensate for non-linearity, thereby reducing circuit complexity, development cost and power consumption.

According to one embodiment, the TDC includes a digitally controlled oscillator, a counter circuit and an evaluation circuit. The digitally controlled oscillator operates at a first frequency during a first portion of a period of a reference signal and changes the operating frequency from the first frequency to a second frequency during the reference signal period as a function of a time difference between a signal of interest and the reference signal. The counter circuit continuously counts how many signal transitions occur at an output of the digitally controlled oscillator during the reference signal period. The evaluation circuit estimates the time difference between the signal of interest and the reference signal based on the number of signal transitions counted during the reference signal period.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
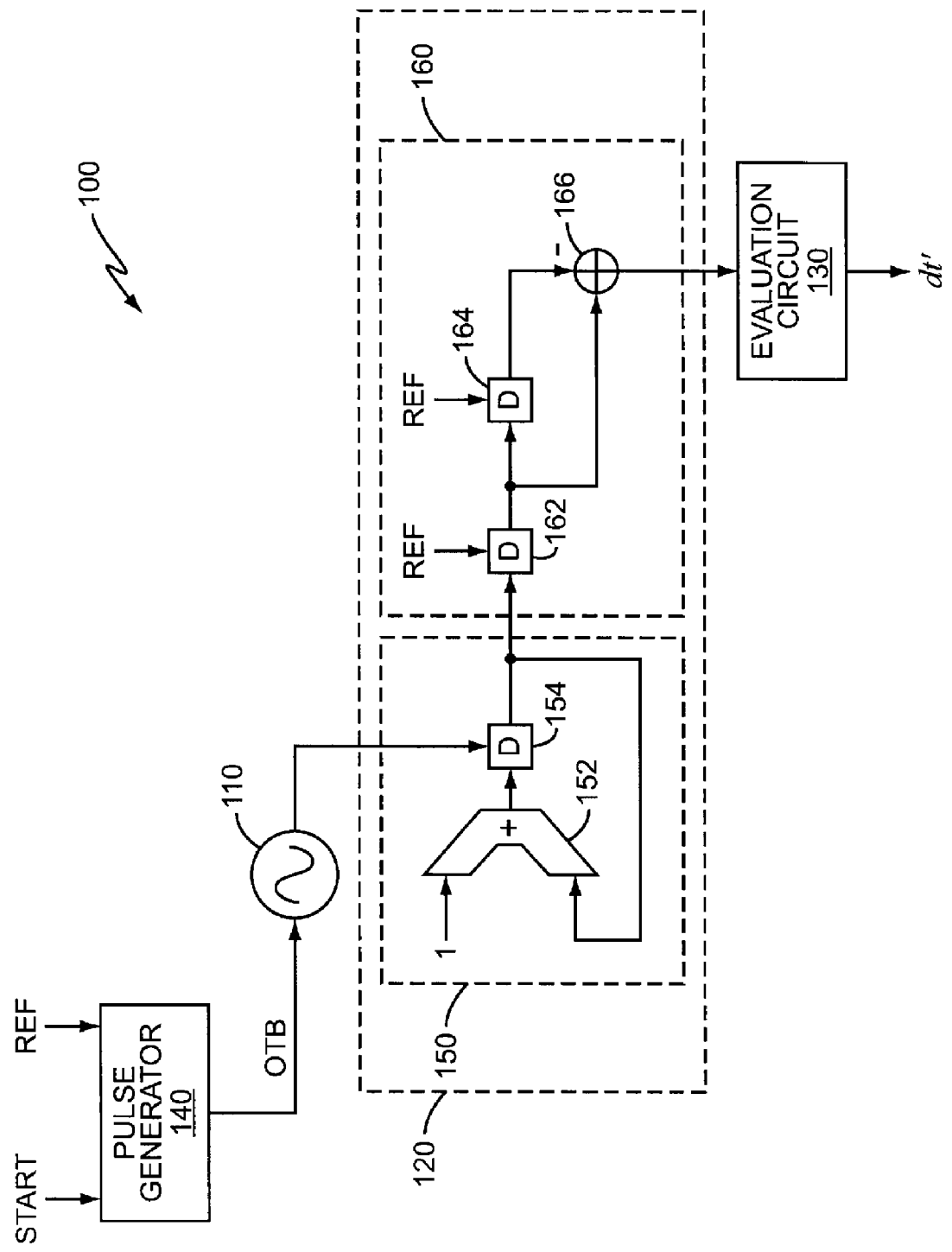
FIG. 1 is a block diagram of an embodiment of a noise shaping time to digital converter.

FIG. 1 illustrates an embodiment of a time to digital converter (TDC) 100. The TDC 100 includes, a digitally controlled oscillator (DCO) 110, a counter circuit 120, an evaluation circuit 130 and a pulse generator 140. The TDC 100 utilizes noise shaping to provide very high resolution time measurement results. When the TDC 100 is operated at a frequency (REF) several times higher than the bandwidth of the signal of interest (START), the TDC 100 has a relatively high signal-to-noise ratio (SNR) compared to conventional non-noise shaping TDCs. In addition, the TDC 100 performs quantization noise shaping by shifting the quantization noise toward higher frequencies. The high frequency noise may be optionally filtered, which yields an effective increase in SNR depending on the over-sampling ratio employed by the TDC 100.

Shaped quantization noise can be modeled as white noise filtered by a differentiating filter. In a sampled system, the transfer function of a differentiating filter can be described as given by:

$$H_{NTF} = 1 - z^{-1} \qquad (1)$$

The noise transfer function represented by equation (1) can be realized by taking the difference between the quantization errors of the current and previous measurement samples generated by any quantizing measurement system. The measurement samples are generated by operating the DCO 110 at two or more different frequencies during each reference signal period, i.e., each cycle of the reference signal. The operating frequency of the DCO 110 is selected based on an oscillator tuning bit (OTB) input to the DCO 110.

Figure 2:
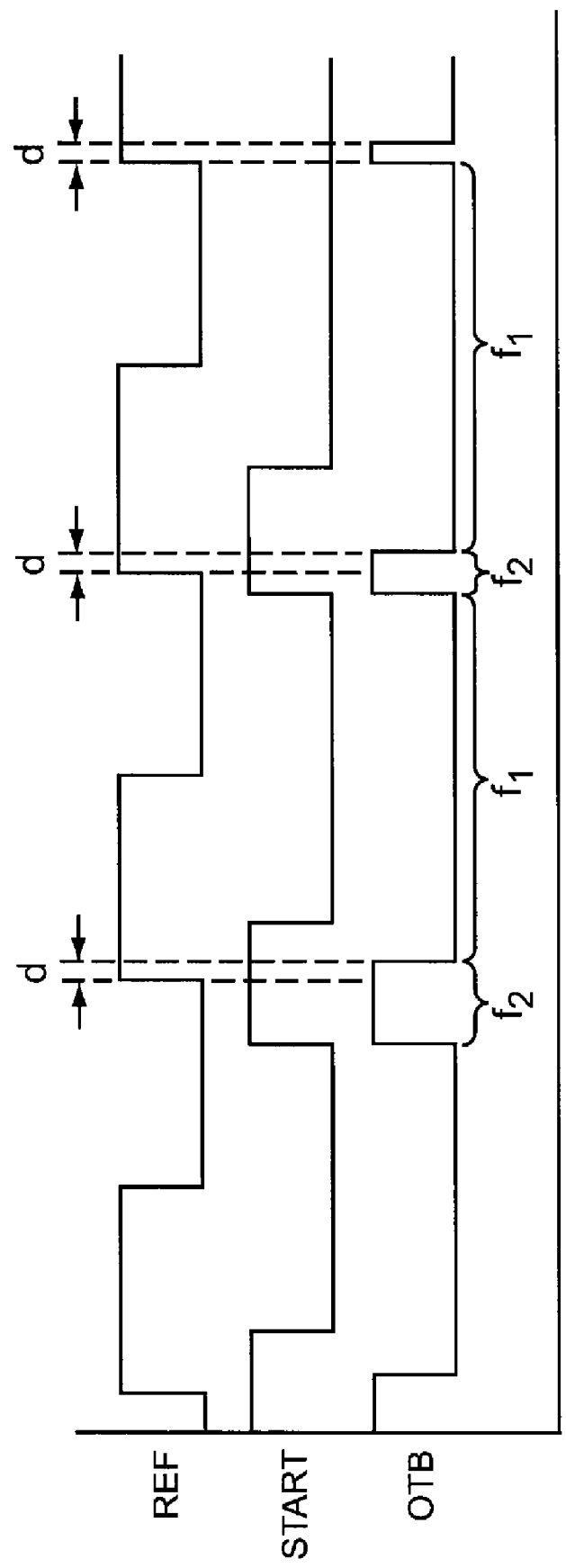
FIG. 2 is a timing diagram illustrating the generation of a pulse signal used to control operation of the time to digital converter of FIG. 1.

In one embodiment, the OTB is controlled by the digital pulse generator 140. The digital pulse generator 140 activates the OTB pulse responsive to a rising edge transition in the signal of interest (START) and terminates the pulse responsive to a rising edge transition in the reference signal (REF) as shown in FIG. 2. Thus, the OTB pulse has a width corresponding to the time difference between rising edges of the START and REF signals. The DCO 110 operates at a first frequency (f1) when the pulse subsides and at a second frequency (f2) when the pulse is active. Thus, the output frequency of the DCO 110 depends on the state of the OTB pulse which in turn depends on the timing relationship between the signal of interest and the reference signal. Accordingly, the operating frequency of the DCO 110 changes from the first frequency (f1) to the second frequency (f2) later in the reference signal period when the time difference between REF and START is relatively small and earlier in the reference signal period when the time difference is relatively large.

The counter circuit 120 of the TDC 100 continuously counts the number of signal transitions observed at the output of the DCO 110 during each reference signal period. In one embodiment, the counter circuit 120 includes a modulo-counter 150 followed by a differentiating circuit 160. The modulo-counter 150 is not reset between reference signal periods, enabling the use of higher clocking speeds. The evaluation circuit 130 estimates the time difference between the signal of interest and the reference signal based on the output of the counter circuit 120. The evaluation circuit 130 also determines the different operating frequencies of the DCO 110 during a calibration mode based on timing information associated with the reference signal.

During operation, the TDC 100 measures and digitizes a time fraction of a known reference time period. In more detail, the pulse generator 140 deactivates the OTB pulse during the first part of the reference signal period, e.g., from a rising edge of REF until a rising edge of START as shown in FIG. 2. During this duration of time, the DCO 110 is operated at a first frequency (f1). The pulse generator 140 then activates the OTB pulse during the fraction of the reference signal period to be measured, e.g., after a rising edge transition in START until a rising edge of REF as shown in FIG. 2. The DCO 110 switches to a second operating frequency (f2) during this portion of the reference signal period.

Figure 3:
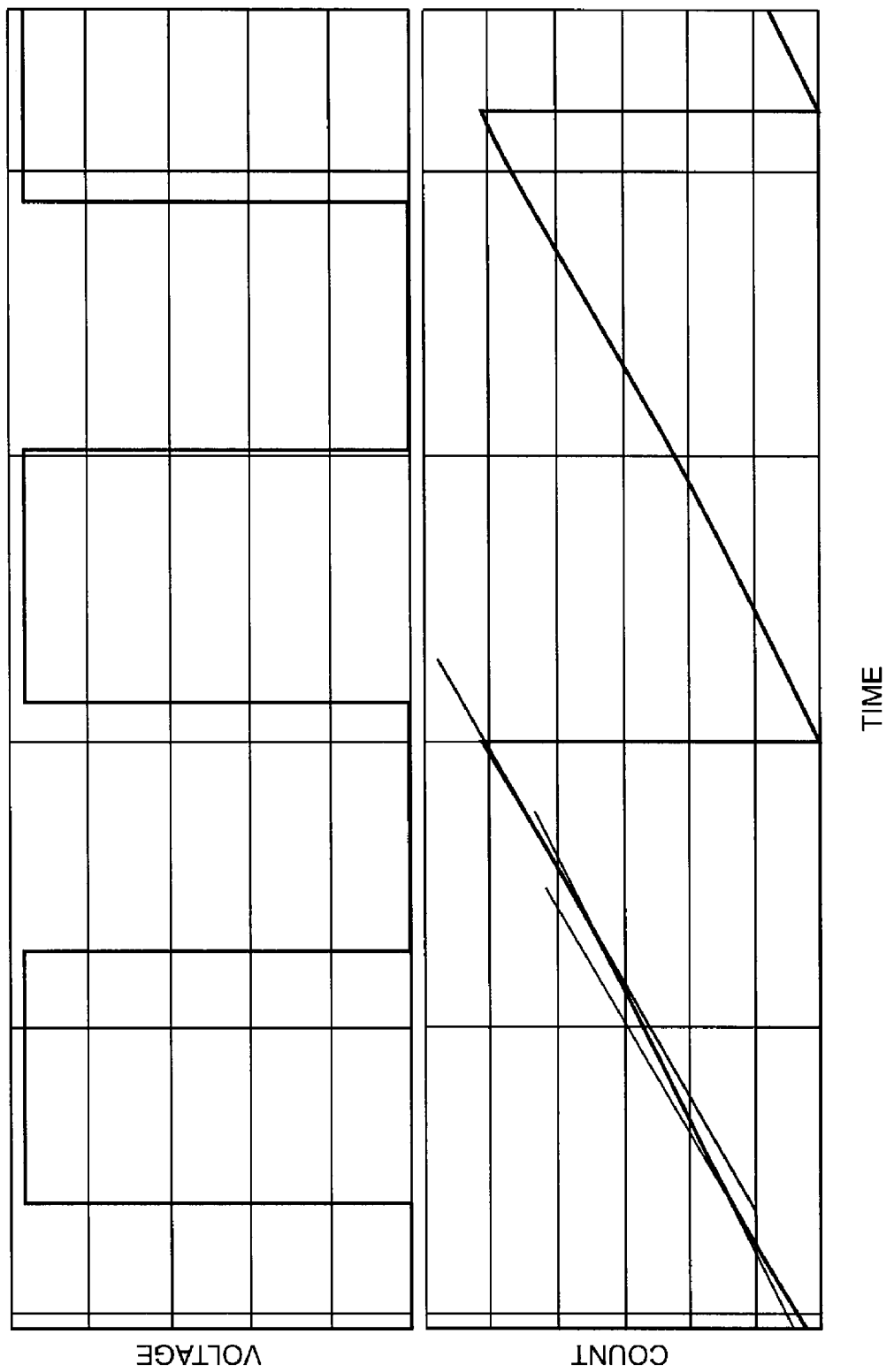
FIGS. 3-4 are timing diagrams associated with the operation of the time to digital converter of FIG. 1.

The counter circuit 120 is connected to the output of the DCO 110 and continuously counts the number of signal transitions at the DCO output during each reference signal period. The modulo-counter circuit 150 essentially accumulates the DCO phase as shown in FIG. 3 where the first graph shows the reference signal and the second graph shows the output of the modulo-counter circuit 150. The different slopes shown in the bottom graph of FIG. 3 demonstrate how the rate of change at the output of the modulo-counter circuit 150 varies depending on the OTB value. That is, the rate at which the modulo-counter circuit 150 accumulates the DCO phase is a function of the OTB, because the DCO operating frequency changes each time the OTB pulse subsides.

In one embodiment, the modulo-counter circuit 150 includes an n-bit adder 152 and a latch 154. The latch 154 stores the current output of the adder 152 when triggered by a rising edge transition of the DCO output and the adder 152 increments the current state of the latch 154 by one. The differentiating circuit 160 compares the count value for the current reference signal period with the count value for the previous reference signal period. In one embodiment, the differentiating circuit 160 includes two latches 162, 164 and a subtractor 166. The first latch 162 captures the count value for the most recent reference signal period during a rising edge transition of the reference signal. This value is passed to the second latch 164 during the next rising edge transition of the reference signal. Accordingly, the latches 162, 164 together hold the count values for two consecutive reference signal periods. The subtractor 166 subtracts the older count value from the more recent count value, extracting the number of DCO cycles counted during the last reference signal period.

Figure 4:
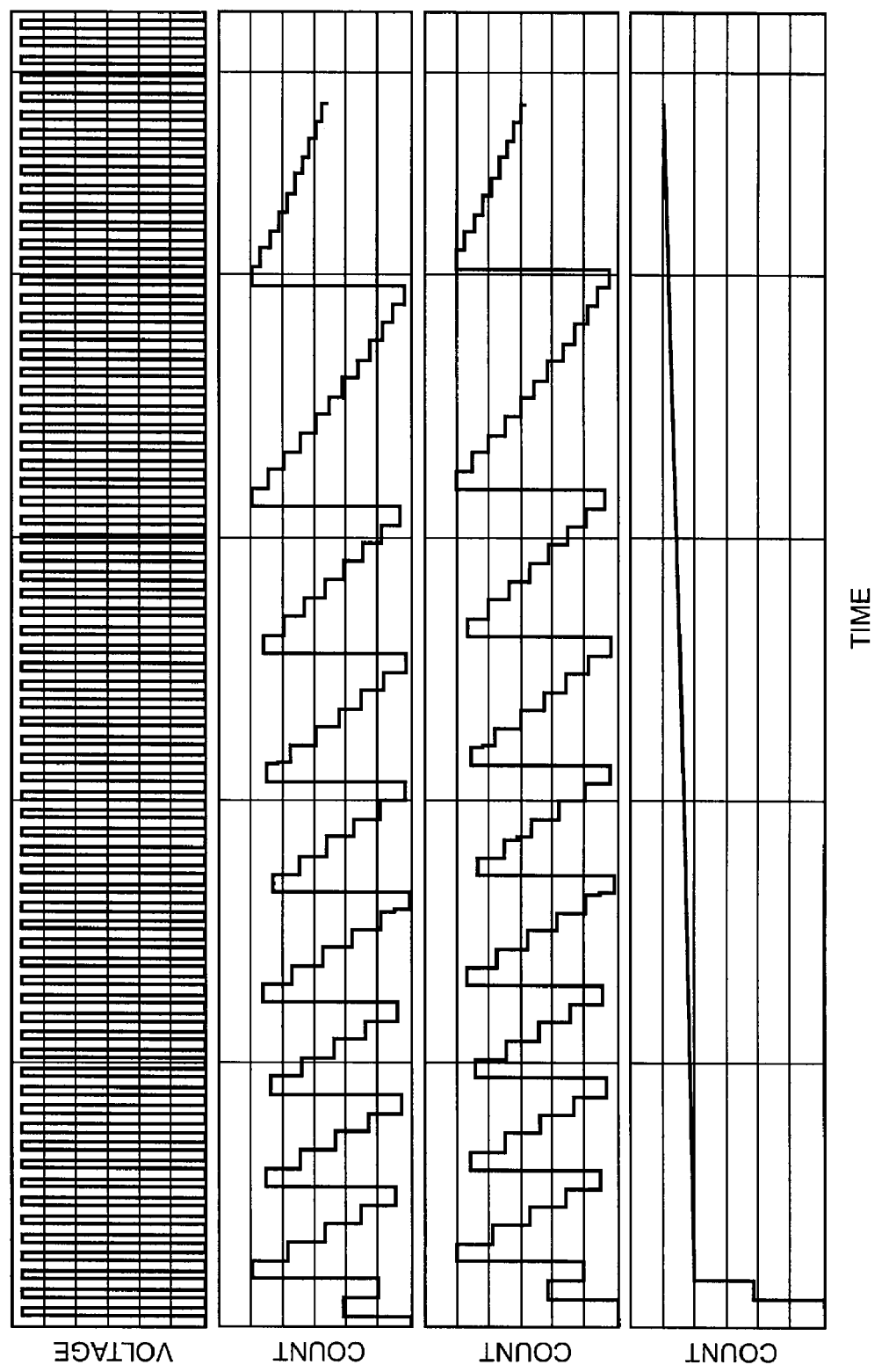

FIG. 4 is a timing diagram illustrating signal processing at different stages of the TDC 100. The topmost graph shows the reference signal (REF). The second graph from the top shows the state of the first latch 162 of the differentiating circuit 160 and the third graph from the top shows the state of the second latch 164 of the differentiating circuit 160. The bottommost graph shows the output of the subtractor 166 for a slowly varying signal.

The evaluation circuit 130 may comprise digital logic or any other type of logic or circuitry for determining the different DCO operating frequencies (e.g., f1 and f2). The evaluation circuit 130 determines the DCO operating frequencies during a calibration mode. The DCO operating frequencies can vary with process, voltage and temperature. The DCO 110 is fixed to the frequencies f1 and f2, respectively, for a number of reference periods during the calibration mode and a time average of the output of the counter 120 is calculated and used as frequency measures as will be described in more detail later herein. The evaluation circuit 130 uses the time-averaged frequency measures to calculate the fraction of the reference signal period during normal operation.

Figure 5:
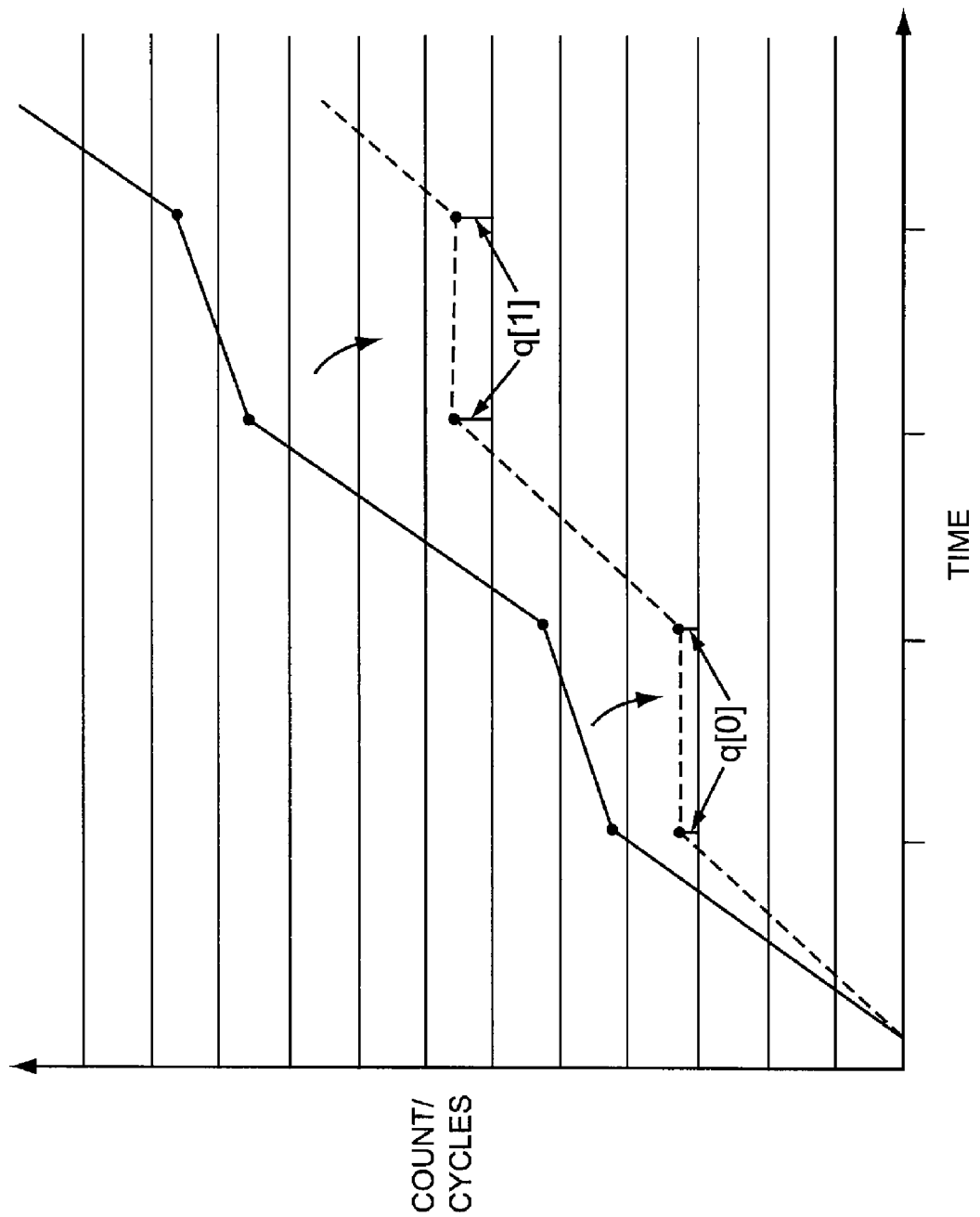
FIG. 5 is a plot diagram illustrating counting and error quantization operations of the time to digital converter of FIG. 1.

Since the DCO operating frequencies (e.g., f1, f2) are calculated during the calibration mode, the evaluation circuit 130 can subtract a phase increase related to one frequency (e.g., f1) from the output of the counter circuit 120. The resulting waveform is shown in FIG. 5 where the solid line represents the phase waveform associated with the DCO 110 in operation. The dashed line represents the phase waveform after processing by the evaluation circuit 130. The quantization errors q[0], q[1] that are subtracted from their respective measures are then added automatically to the succeeding measures, which means that they both undergo first order noise shaping.

Figure 6:
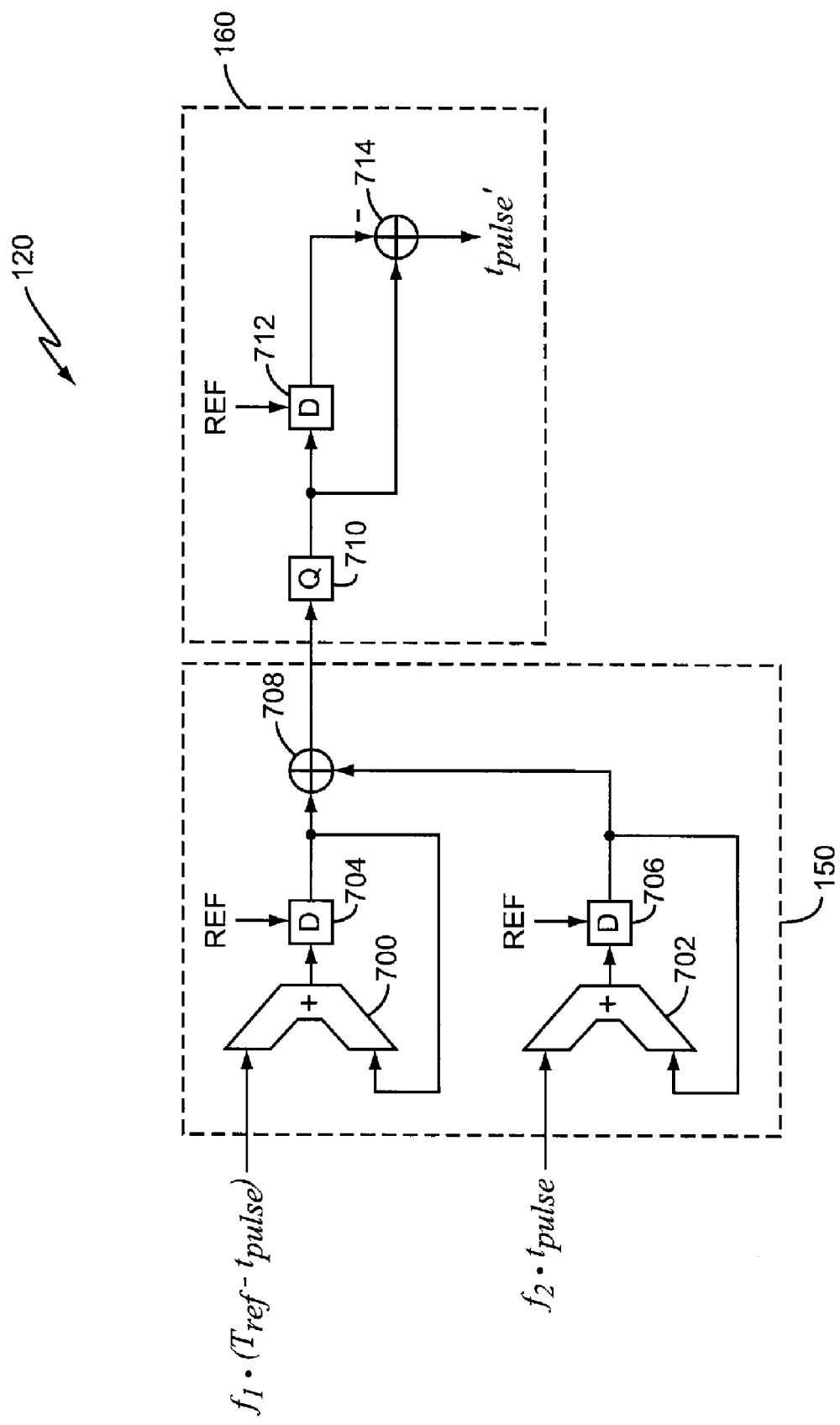
FIGS. 6-8 illustrate the time to digital converter of FIG. 1 at different stages of being transformed into the z-domain.

A more theoretical explanation of the TDC 100 is described next in the z-domain. FIG. 6 shows an equivalent model of the counter circuit 120 where a single input sample frequency (REF) is used. The modulo-counter 150 includes two adders 700, 702, two latches 704, 706 each clocked by the reference signal and an adder 708. The two input quantities summed represent the phase increase (measured in cycles, not radians) of the DCO 110 during one reference signal period. The differentiating circuit 160 includes a quantizer 710 for truncating the phase measure to an integer number because the modulo-counter circuit 150 in practice only resolves integer multiples of the DCO output phase. The quantizer output is stored by a latch 712 clocked by the reference signal. Two consecutive quantized signals are subtracted by a subtractor 714 to generate a time measurement output (tpulse').

Figure 7:
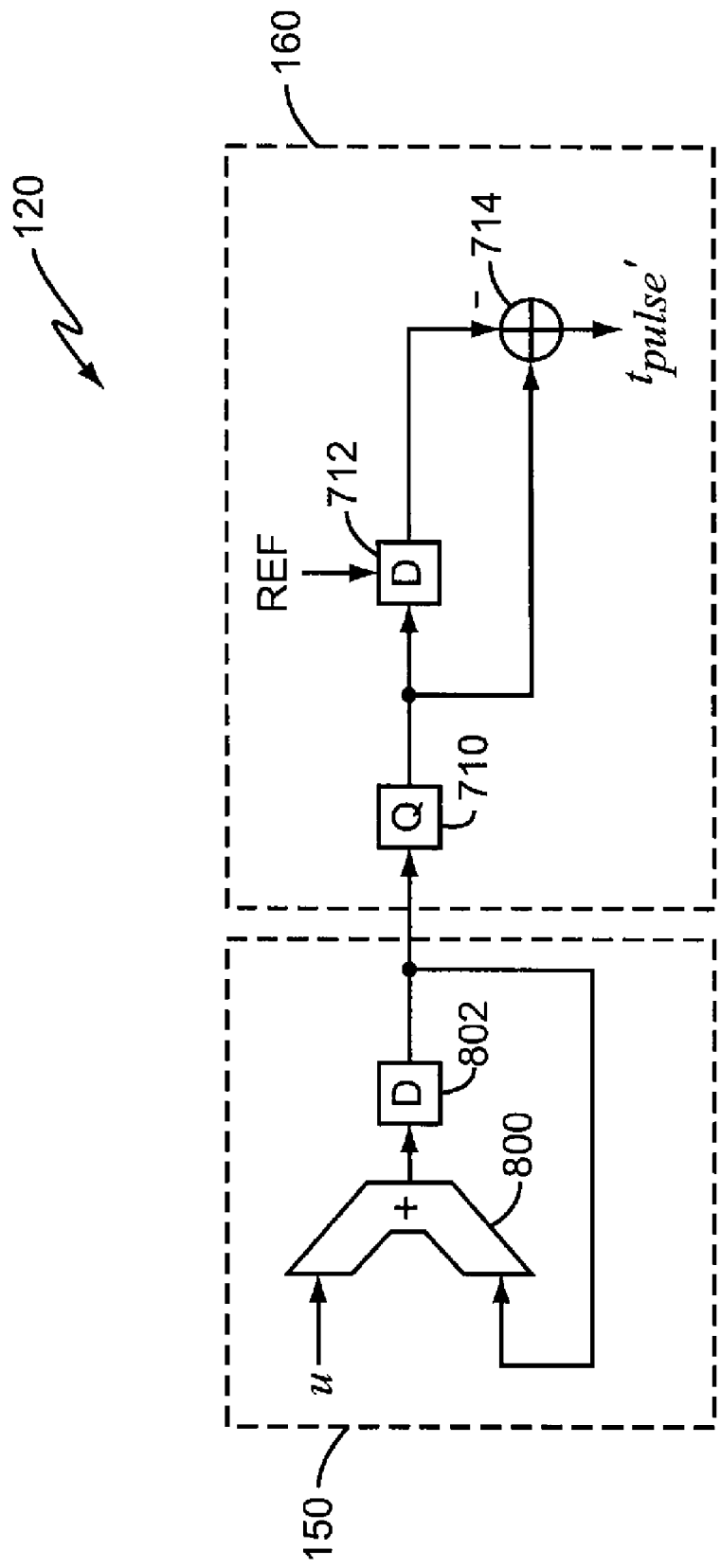

FIG. 7 shows the counter circuit 120 further simplified. Here, the modulo counter circuit 150 includes a single adder 800 and latch 802. The adder 800 sums the output of the latch 802 with a first input (u) represented by:

$$u = f_1 \cdot T_{ref} + (f_2 - f_1) \cdot t_{pulse} \qquad (2)$$

The differentiating circuit 160 again includes the quantizer 710, latch 712 and subtractor 714 for generating a time measurement output (tpulse') as described above.

Figure 8:
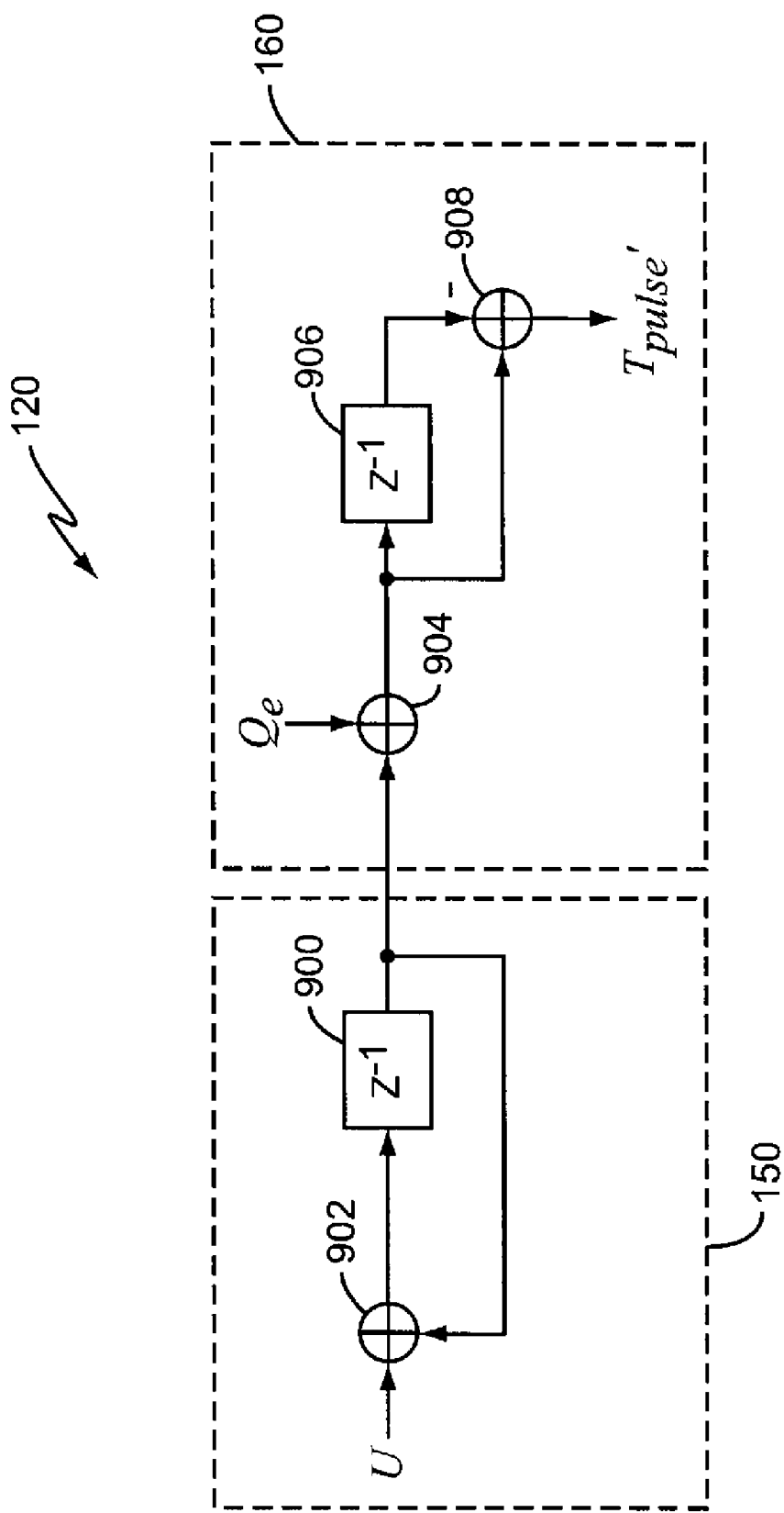

FIG. 8 shows the counter circuit 120 even further simplified to a linear model in the z-domain. The modulo-counter circuit 150 includes a delay block 900 having an output fed back to a summer block 902 along with an input signal (U). The output of the modulo-counter delay block 900 is also input to a summer 904 of the differentiating circuit 160. A quantization error value (Qe) is also input to the summer 904. The output of the summer 904 is input to a delay block 906 and a subtractor 908 of the differentiating circuit 160. The subtractor 908 generates a time measurement output (Tpulse') as given by the following transfer function:

$$H_{STF} = \frac{T'_{pulse}}{U} = \frac{1}{z-1}(1 - z^{-1}) = z^{-1} \qquad (3)$$

The transfer function from Qe to Dt' is given by:

$$H_{NTF} = \frac{T'_{pulse}}{Q_e} = 1 - z^{-1} \qquad (4)$$

Accordingly, the energy of the quantization error Qe is uniformly distributed in the frequency domain between DC and the reference signal frequency (apart from its DC-component). Thus, the output quantization noise PSD (power spectral density) is first order shaped and the input quantity U, which is linearly dependant of the unknown time fraction, is delayed.

In one embodiment, the DCO 110 is a ring oscillator. According to this embodiment, the counter circuit 120 samples the output of more than one stage of the ring-oscillator to extract an average count value. Extracting timing information from more than one stage of the ring oscillator increases resolution of the TDC 100 and reduces the need for a high over-sampling ratio. In another embodiment, the DCO 110 is an LC-tank circuit. In each case, the TDC 100 preferably uses a minimum amount of time in each DCO frequency state during each reference signal period. This prevents dead-zones where very short pulses cannot be resolved because of the inability to ideally switch transistors on and off quickly enough. In one embodiment, the pulse generator 140 adds a delay (d) to the OTB pulse, extending the falling edge of the OTB pulse beyond the rising edge of the reference signal (REF) for each reference signal period as shown in FIG. 2. The same delay is used during the calibration mode so that the delay does not introduce errors into the time measurement process carried out by the TDC 100 during normal operation.

Figure 9:
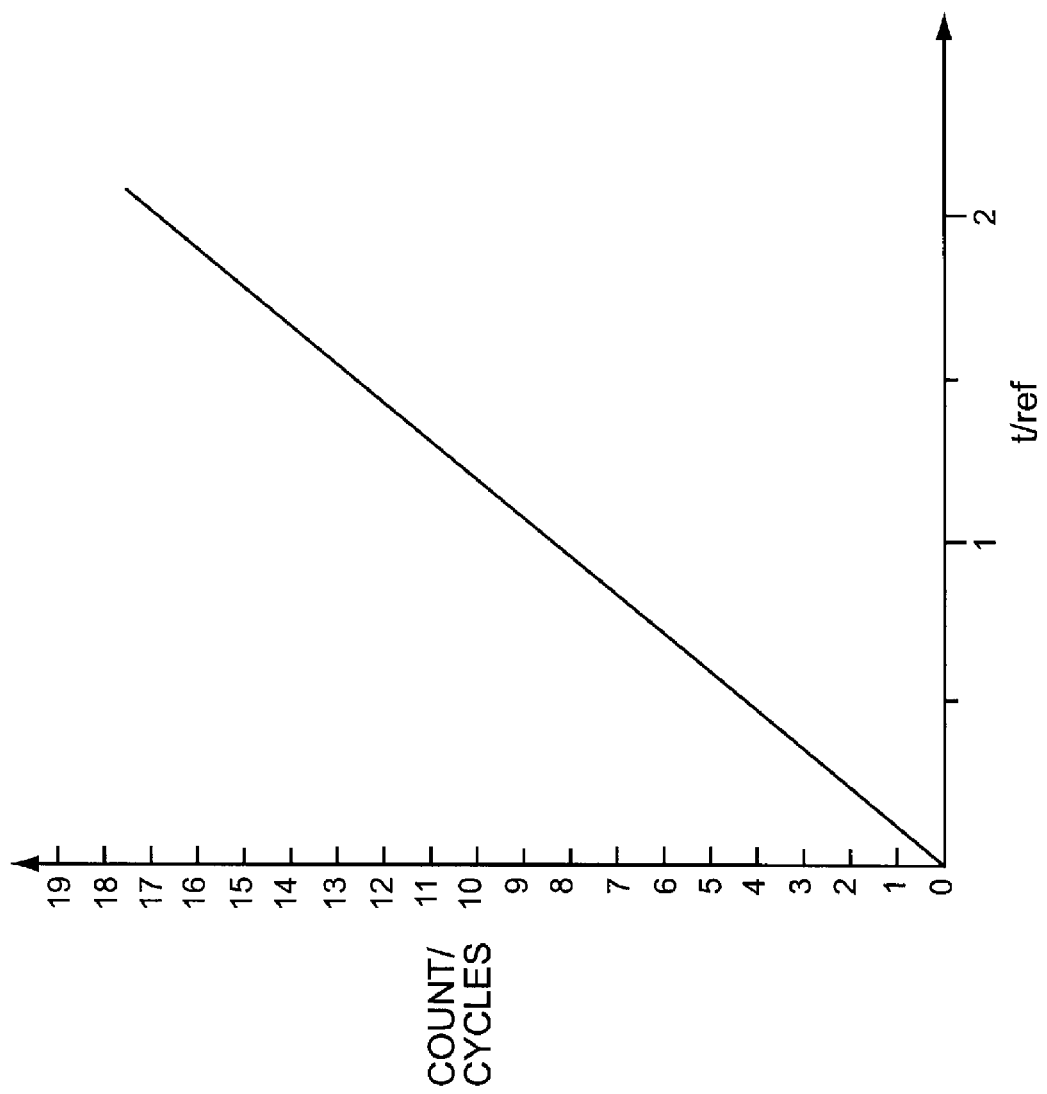
FIGS. 9-12 illustrate different stages of a calibration mode performed for the time to digital converter of FIG. 1.

In one embodiment, the calibration mode begins by determining the second frequency (f2). The second frequency can be determined by setting the OTB-bit constantly active. FIG. 9 shows the DCO-phase when the OTB-bit is constantly active where the x-axis represents the time measured in reference cycles. Since the reference signal is assumed to be known, all frequencies can be normalized to the reference signal so that the reference signal has frequency=1. Setting the OTB active in this way causes the counter circuit 120 to output a count value of either 8 or 9 as shown in FIG. 9. In this example, the counter circuit 120 outputs a count value of 8 one-third of the time and a count value of 9 two-thirds of the time. Thus, over a long period of time, the second frequency (f2) time-averages to 8.667. The longer the counter circuit 120 runs, the more accurate the time-averaging function becomes. For example, if only the two first measures were used, the average frequency for f2 would be 8.5.

Figure 10:
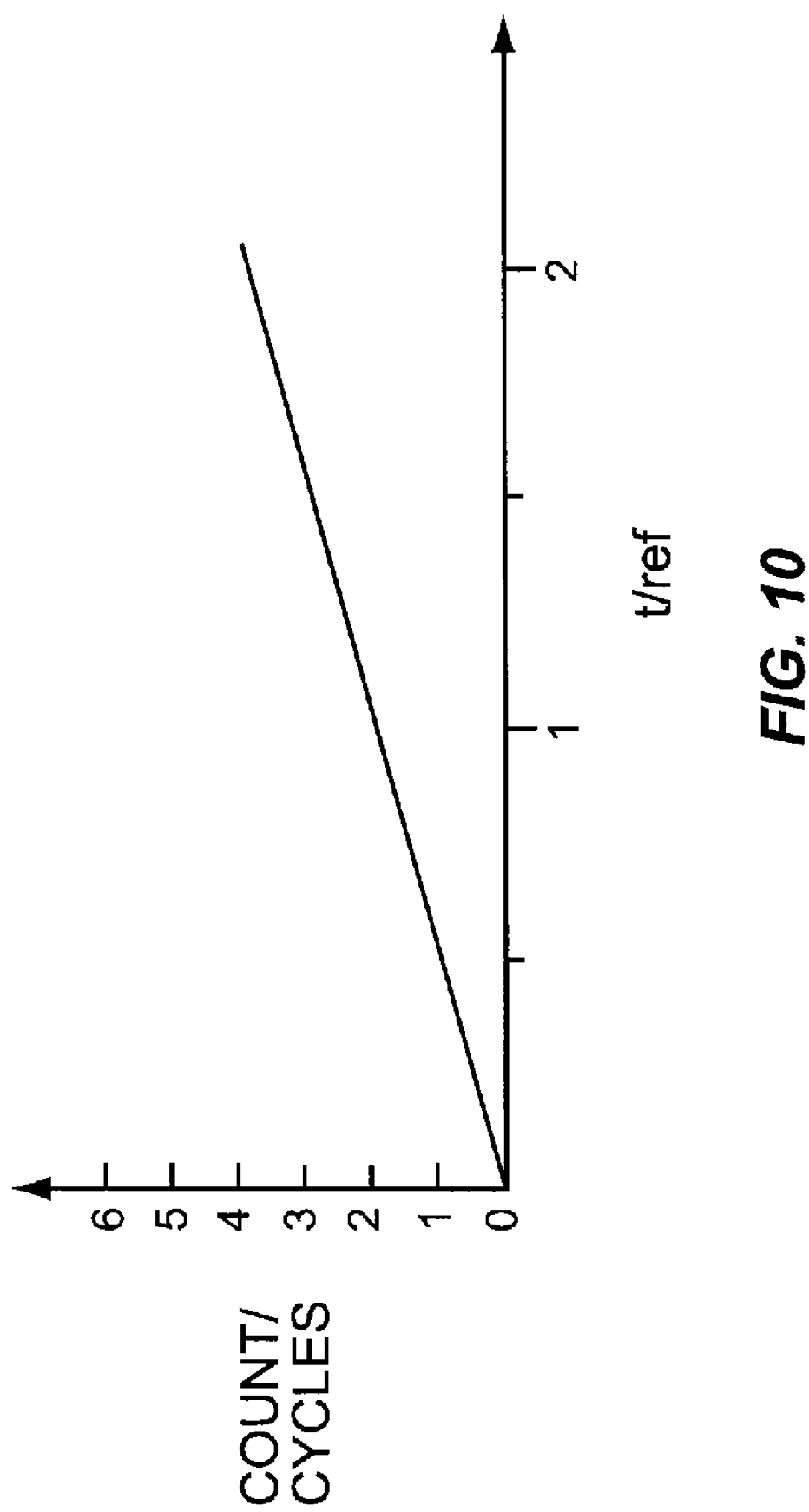

The first frequency (f1) is then determined. The first frequency is determined by setting the OTB-bit to zero. FIG. 10 shows the DCO-phase when the OTB-bit is set to zero. The same procedure for calculating f2 described above is repeated again to compute f1. In this example, f1 is twice the reference frequency. Accordingly, the counter circuit 120 outputs a count value of 2. The calibration process may terminate at this point when the frequency switching time is zero (i.e., no delay is added to the OTB pulse to account for dead zones).

Figure 11:
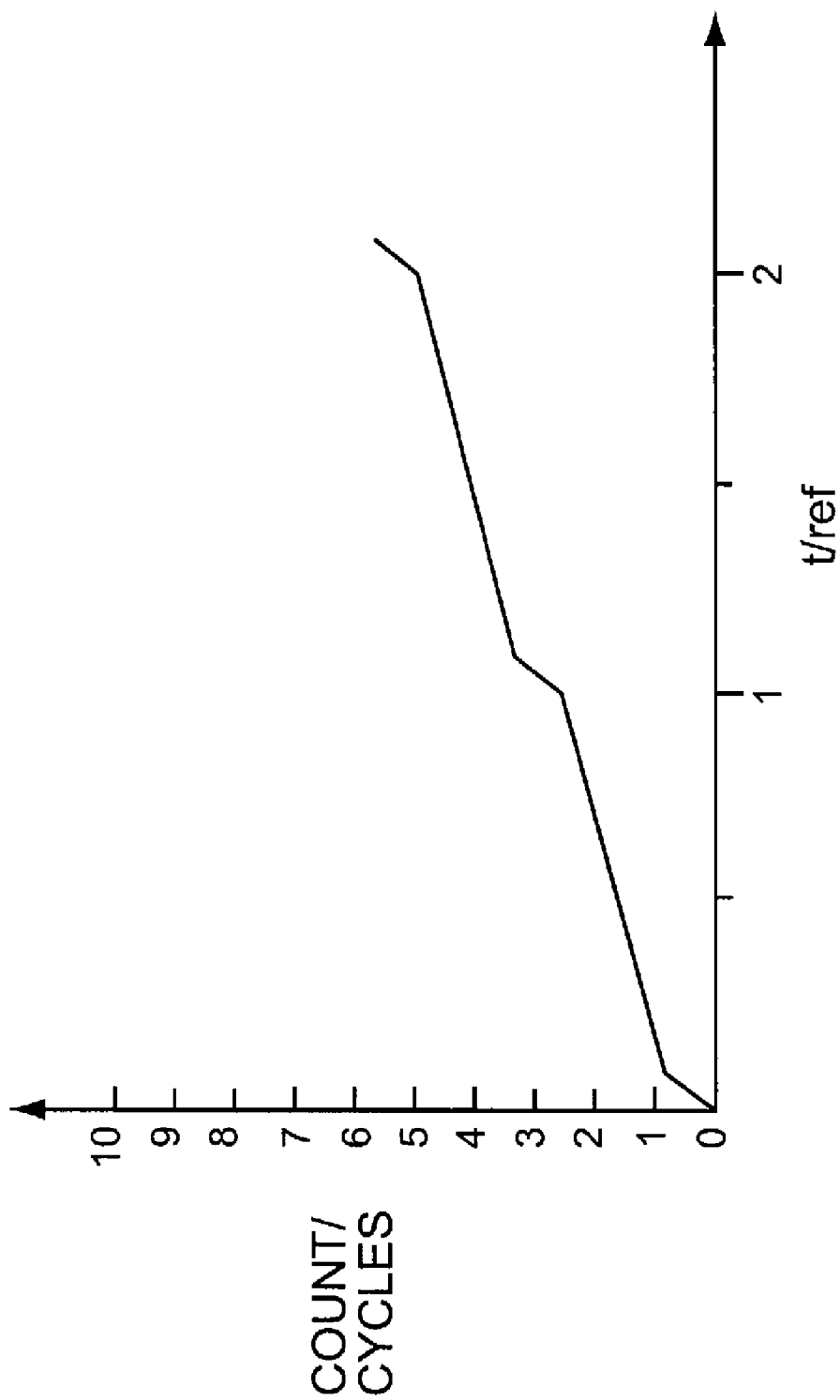

However, when the pulse generator 140 adds a delay (d) to the OTB pulse to account for dead zones as described above, the calibration mode also involves correcting the time delay value. In one embodiment, the pulse-generation circuit 140 generates a single OTB pulse having a time delay (d). FIG. 11 shows the DCO-phase when a single delay (d) is added to the OTB pulse while the OTB-bit is set to zero. In this example, the counter circuit 120 outputs count values of 2 and 3 approximately the same number of times. Accordingly, the equivalent frequency (fm)=2.5.

Figure 12:
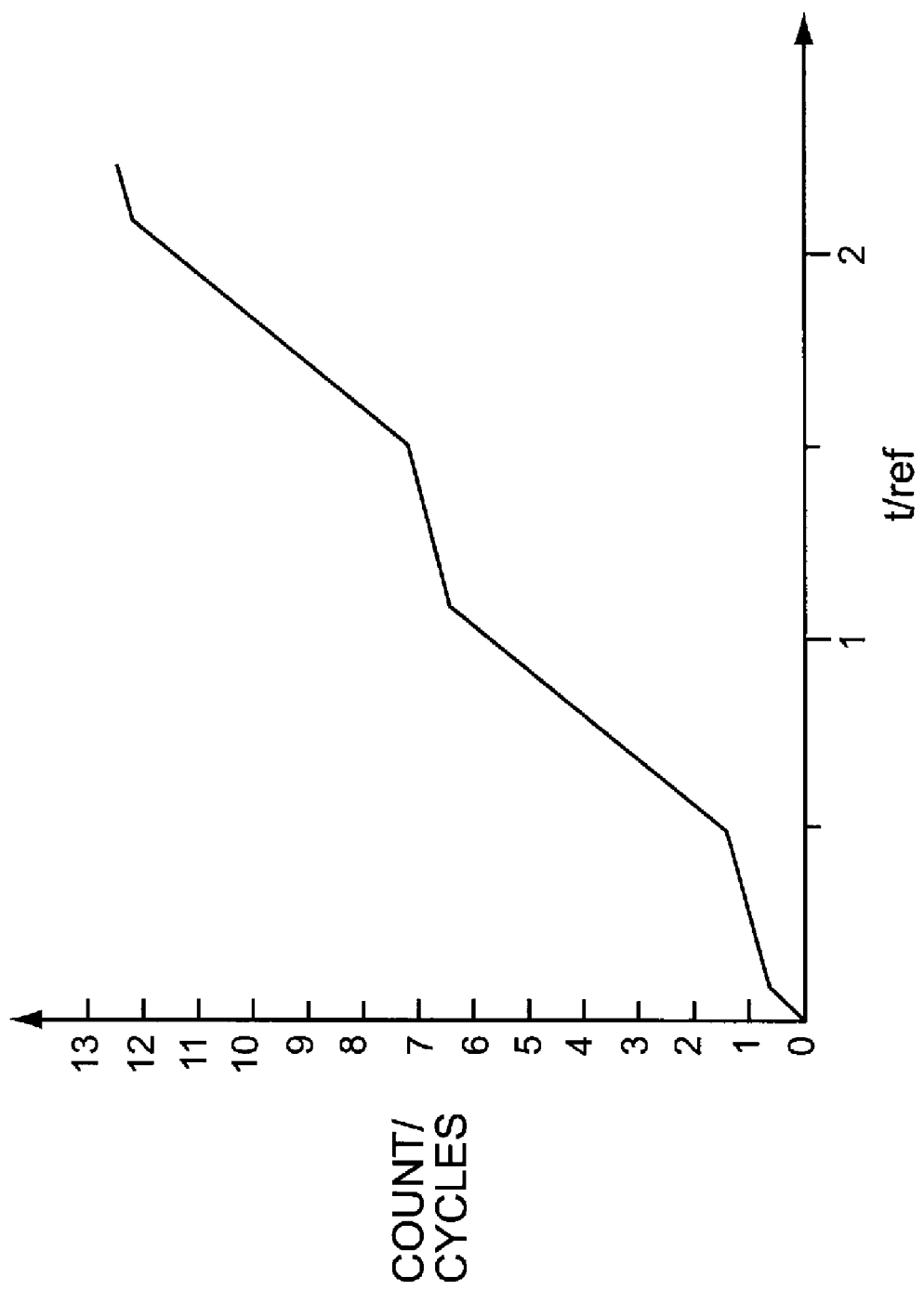

After the values for f1, f2 and fm are determined, the TDC 100 can begin normal operation. Consider, for example, normal operating conditions where the time to be digitized is ½ of the reference time period. FIG. 12 shows the DCO-phase under these conditions. FIG. 12 shows that the DCO 110 runs at f2 for half the reference period plus the extra time delay (d) added for eliminating dead-zones. The first two numbers k at the output of the counter circuit 120 are 5 and 6, respectively. The evaluation circuit 130 uses these numbers to determine the time fraction according to the formula below:

$$dt' = \frac{k - f_m}{f_2 - f_1} \left| k=5 \right| = \frac{5 - 2.5}{8.667 - 2} \approx 0.375 \left\| k=6 \right| = \frac{6 - 2.5}{8.667 - 2} \approx 0.525 \right| \qquad (5)$$

The average value of the time fraction converges toward 0.5 when the input time is kept relatively constant at 0.5*Tref. The phase increase during each reference cycle can be represented as:

$$p = f_m + (f_2 - f_1) \cdot dt = 2.5 + (8.667 - 2) \cdot 0.5 \approx 5.83 \qquad (6)$$

Alternatively, the phase increase value for the TDC 100 can be read from the graph shown in FIG. 12.

Figure 13:
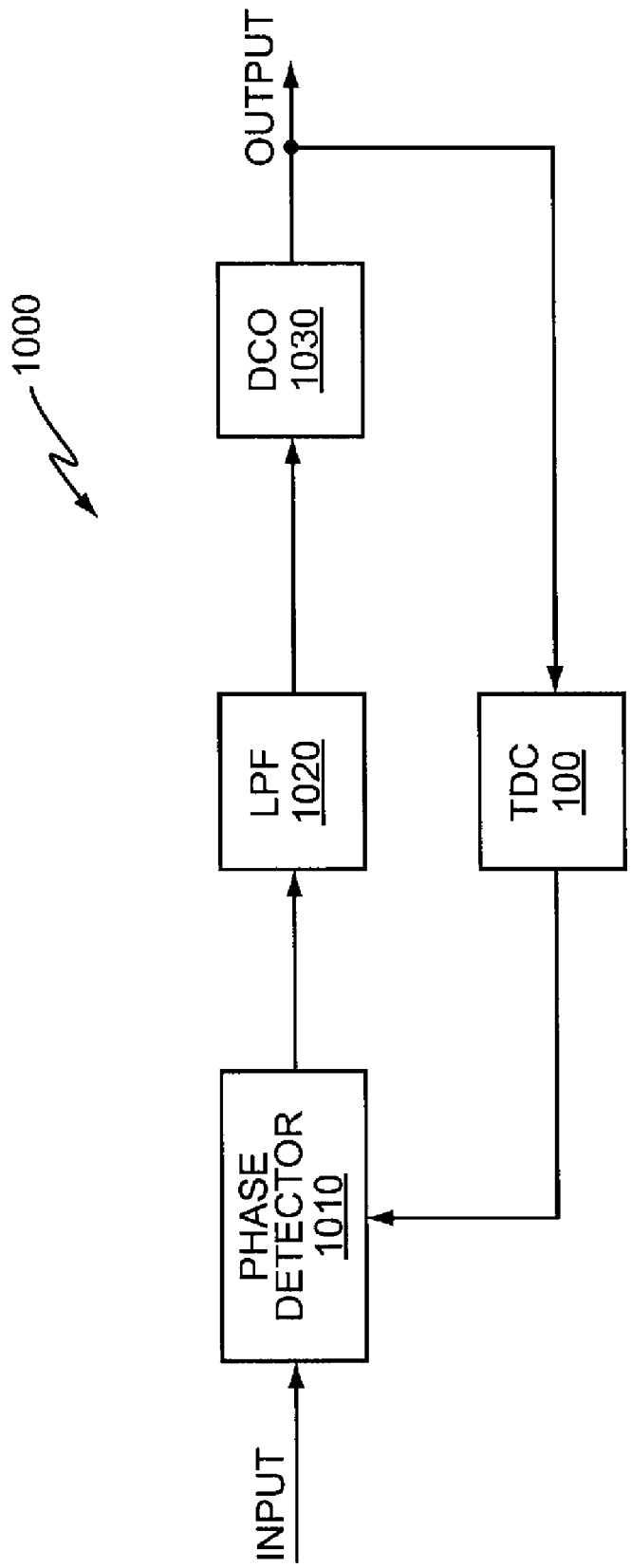
FIG. 13 is a block diagram of an embodiment of a digital phase-locked loop including the time to digital converter of FIG. 1.

The TDC 100 can be used in various types of circuits. FIG. 13 illustrates one embodiment where the TDC 100 is included in a digital phase-locked loop (DPLL) 1000. The DPLL 1000 includes a phase detector 1010, low pass filter 1020, DCO 1030 and the TDC 100. The TDC 100 processes the output of the DPLL DCO 1030 to determine timing information from the DCO output. The extracted timing information is fed back to the phase detector 1010 to control phase or frequency locking of the DPLL 1000. In some embodiments, the DPLL bandwidth is no more than a few MHz. Accordingly, the TDC 100 samples the DPLL DCO output at a few hundreds of MHz. The resolution and SNR of the DPLL 1000 is significantly increased because the TDC 100 employs over-sampling and noise shaping. Simulation has shown that the TDC 100 improves integrated phase noise of the DPLL 1000 by more than 10 dB over conventional TDCs for DCO operating frequencies f2=6.0 GHz and f1=5.0 GHz. The integrated phase noise can be further improved if the loop filter 1020 is made steeper and/or by increasing the difference between f1 and f2.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A method of measuring a time difference between a signal of interest and a reference signal, comprising:
   operating a digitally controlled oscillator (DCO) at a first frequency during a first portion of the reference signal period;
   changing the operating frequency of the DCO from the first frequency to a second frequency during the reference signal period as a function of the time difference between the signal of interest and the reference signal;
   continuously counting how many signal transitions occur at an output of the DCO during the reference signal period; and
   estimating the time difference between the signal of interest and the reference signal based on the number of signal transitions counted during the reference signal period.

2. The method of claim 1, comprising changing the operating frequency of the DCO from the first frequency to the second frequency earlier in the reference signal period when the time difference is relatively large and later in the reference signal period when the time difference is relatively small.

3. The method of claim 1, comprising:
   increasing a running count value each time a signal transition occurs at the output of the DCO over a plurality of reference signal periods;
   storing the running count value accumulated during each reference signal period; and
   comparing the running count values stored for consecutive reference signal periods.

4. The method of claim 1, comprising determining the first and second frequencies during a calibration mode.

5. The method of claim 4, comprising determining the first and second frequencies based on a time-averaged number of signal transitions observed at the output of the DCO during the calibration mode.

6. The method of claim 1, comprising:
   generating a pulse having a width corresponding to the time difference between the signal of interest and the reference signal; and
   operating the DCO at the first frequency when the pulse subsides and at the second frequency when the pulse is active.

7. The method of claim 6, comprising:
   activating the pulse responsive to a rising edge transition in the signal of interest; and
   terminating the pulse responsive to a rising edge transition in the reference signal.

8. The method of claim 6, comprising extending the width of the pulse by a fixed delay.

9. The method of claim 6, comprising inputting the pulse to the DCO as one or more frequency tuning bits.

10. The method of claim 1, wherein the signal of interest is an output of a digital phase-locked loop.

11. A time to digital converter, comprising:
   a digitally controlled oscillator (DCO) configured to operate at a first frequency during a first portion of a period of a reference signal and change operating frequency from the first frequency to a second frequency during the reference signal period as a function of a time difference between a signal of interest and the reference signal;
   a counter circuit configured to continuously count how many signal transitions occur at an output of the DCO during the reference signal period; and
   an evaluation circuit configured to estimate the time difference between the signal of interest and the reference signal based on the number of signal transitions counted during the reference signal period.

12. The time to digital converter of claim 11, wherein the DCO is configured to change from the first frequency to the second frequency earlier in the reference signal period when the time difference is relatively large and later in the reference signal period when the time difference is relatively small.

13. The time to digital converter of claim 11, wherein the counter circuit is configured to increase a running count value each time a signal transition occurs at the output of the DCO over a plurality of reference signal periods and store the running count value accumulated during each reference signal period and compare the running count values stored for consecutive reference signal periods.

14. The time to digital converter of claim 11, comprising the evaluation circuit is configured to determine the first and second frequencies during a calibration mode.

15. The time to digital converter of claim 14, wherein the evaluation circuit is configured to determine the first and second frequencies based on a time-averaged number of signal transitions observed at the output of the DCO during the calibration mode.

16. The time to digital converter of claim 11, comprising a pulse generation circuit configured to generate a pulse having a width corresponding to the time difference between the signal of interest and the reference signal and wherein the DCO is configured to operate at the first frequency when the pulse subsides and at the second frequency when the pulse is active.

17. The time to digital converter of claim 16, wherein the pulse generation circuit is configured to activate the pulse responsive to a rising edge transition in the signal of interest and terminate the pulse responsive to a rising edge transition in the reference signal.

18. The time to digital converter of claim 16, wherein the pulse generation circuit is configured to extend the width of the pulse by a fixed delay.

19. The time to digital converter of claim 16, wherein the pulse is input to the DCO as one or more frequency tuning bits.

20. A digital phase-locked loop comprising the time to digital converter of claim 11.

* * * * *